(12) United States Patent
Huang et al.

(10) Patent No.: US 11,469,108 B2
(45) Date of Patent: Oct. 11, 2022

(54) SYSTEM, SEMICONDUCTOR DEVICE AND METHOD

(71) Applicant: Taiwan Semiconductor Manufacturing Company, Ltd., Hsinchu (TW)

(72) Inventors: Wei Han Huang, Taipei (TW); Lun-Kuang Tan, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 216 days.

(21) Appl. No.: 16/551,328

(22) Filed: Aug. 26, 2019

(65) Prior Publication Data

US 2020/0075337 A1 Mar. 5, 2020

Related U.S. Application Data

(60) Provisional application No. 62/726,034, filed on Aug. 31, 2018.

(51) Int. Cl.
| | |
|---|---|
| *H01L 21/266* | (2006.01) |
| *H01L 21/68* | (2006.01) |
| *H01J 37/20* | (2006.01) |
| *H01J 37/317* | (2006.01) |

(52) U.S. Cl.
CPC .......... *H01L 21/266* (2013.01); *H01J 37/20* (2013.01); *H01J 37/3171* (2013.01); *H01L 21/68* (2013.01); *H01J 2237/20285* (2013.01)

(58) Field of Classification Search
None
See application file for complete search history.

(56) References Cited

U.S. PATENT DOCUMENTS

| | | | |
|---|---|---|---|
| 5,688,700 | A | 11/1997 | Kao et al. |
| 6,913,857 | B2 | 7/2005 | Sasago et al. |
| 9,401,260 | B2 | 7/2016 | Lane |
| 2002/0066872 | A1 | 6/2002 | Nishihashi et al. |
| 2017/0076905 | A1 | 3/2017 | Borodovsky et al. |
| 2020/0075337 | A1* | 3/2020 | Huang ........... H01L 21/266 |

FOREIGN PATENT DOCUMENTS

| | | |
|---|---|---|
| CN | 1406392 A | 3/2003 |
| CN | 105247660 A | 1/2016 |
| WO | 2011104178 A1 | 9/2011 |

* cited by examiner

*Primary Examiner* — Jack S Chen
(74) *Attorney, Agent, or Firm* — Slater Matsil, LLP

(57) ABSTRACT

Systems and methods are described herein for the variable and dynamic control of a variable aperture masking unit to define, isolate and/or mask diffusion areas for dopant implantation and/or thermal annealing processes useful in wafer fabrication in the production of advanced semiconductor devices. A plurality of isolation material panels can be dynamically positioned to define a size, position and shape of a variable mask aperture between edges of the plurality of isolation material panels. The isolation material panels are connected between cooperating pairs of carriers that are coupled to and travel along a set of parallel tracks on opposite sides of the variable aperture masking unit.

20 Claims, 8 Drawing Sheets

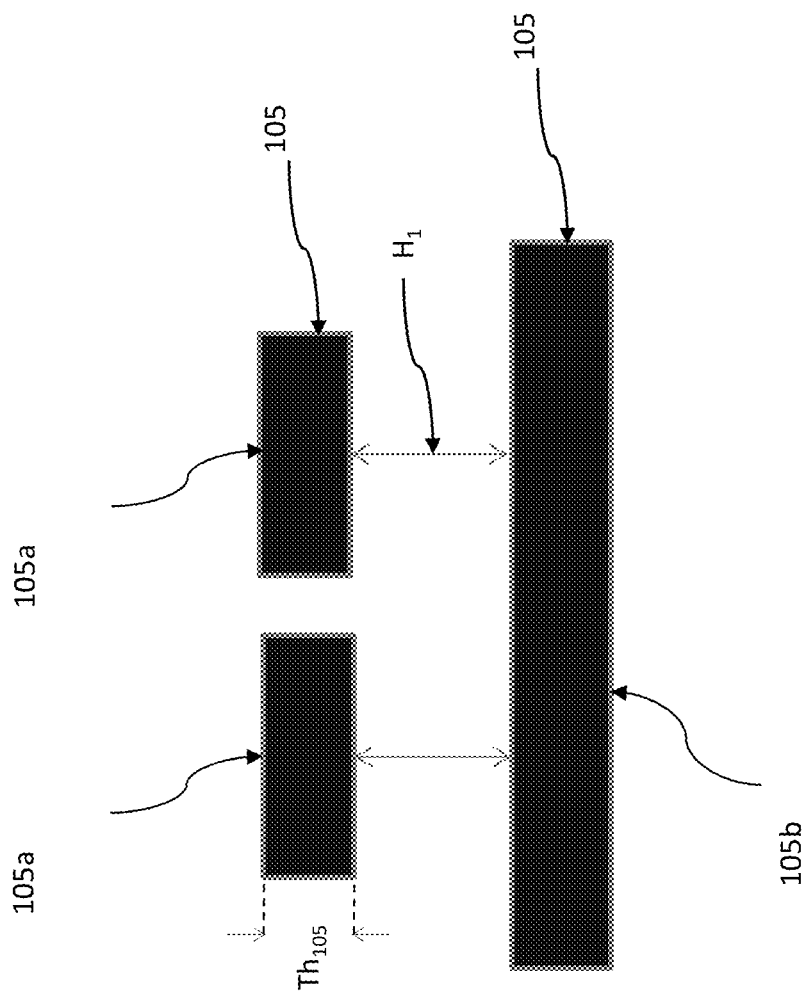

SYSTEM, SEMICONDUCTOR DEVICE AND METHOD

PRIORITY CLAIM AND CROSS REFERENCE

This application claims the benefit of U.S. Provisional Application No. 62/726,034, filed on Aug. 31, 2018, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes in combination with dopant implantation and thermal annealing techniques to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise within each of the processes and techniques that are used, and these additional problems should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Embodiments are described below with respect to semiconductor manufacturing methods and tools for dynamically controlling areas of exposure for performing annealing processes and for defining locations for dopant implantation within semiconductor substrates, or the like. However, the embodiments described may be utilized in a wide variety of processes and devices, and are not limited to the embodiments listed above.

FIG. 2A illustrates an arrangement of isolation material panels of the variable aperture masking unit of FIG. 1, in accordance with some embodiments.

DETAILED DESCRIPTION

Figure 1:
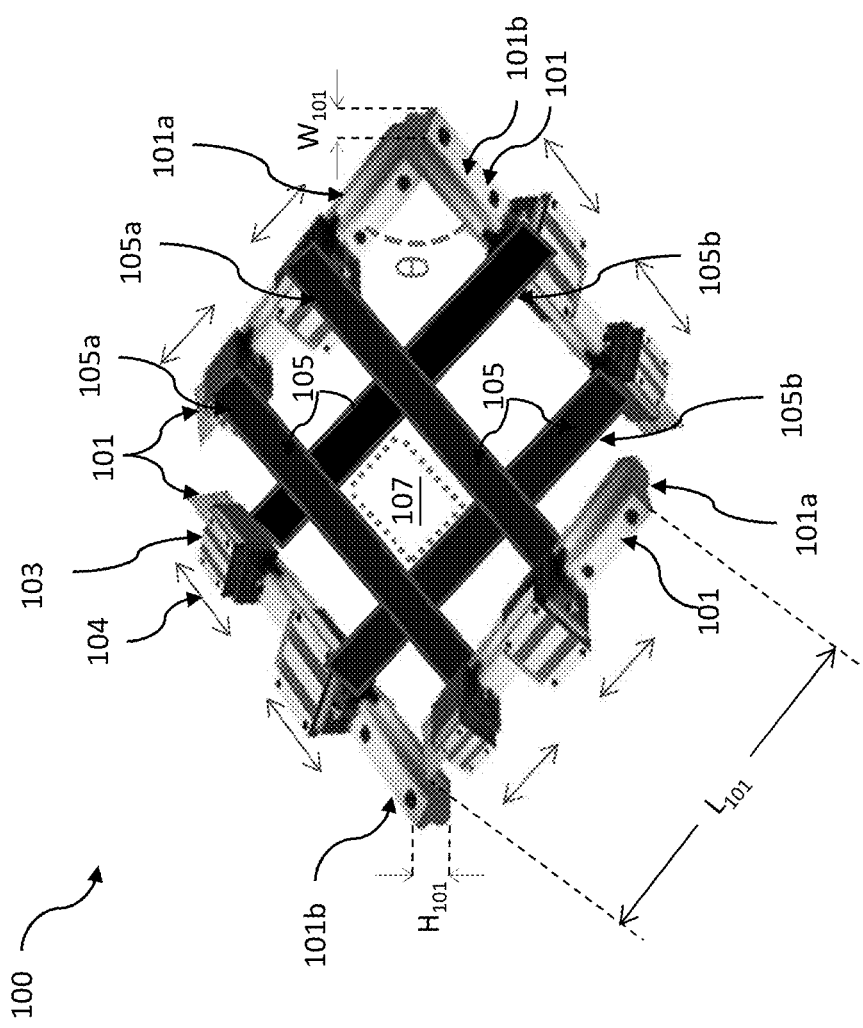
FIG. 1 illustrates a variable aperture masking unit for performing dopant implantations and annealing processes, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Systems and methods for the variable and dynamic control for defining, isolating and/or masking of diffusion areas and of thermal annealing areas are described herein, according to some embodiments. The systems, equipment, tools, structures, and techniques, according to some embodiments, provide for highly controlled and efficient methods of performing dopant implantation (e.g., ion implantation) and thermal treatments (e.g., annealing) useful in wafer fabrication in the production of advanced semiconductor devices. The embodiments described herein, minimize, prevent and/or avoid extra and/or unnecessary thermal stresses (e.g., pattern loading effect) placed on different materials and different areas of the wafer during fabrication. Furthermore, the embodiments described herein, provide highly controlled localization of areas of the semiconductor substrate that are exposed to dopant implantation and/or exposed to thermal treatments during wafer fabrication with highly consistent and uniform annealing results and issues (e.g., stitching effect) caused by multiple scans and non-uniformity of the thermal treatment are minimized, prevented and/or altogether avoided. Moreover, due to the variable and dynamic control for defining, isolating and/or masking of diffusion areas during dopant implantation, the use of multiple masks to define the implantation area may be avoided.

FIG. 1 illustrates a variable aperture masking unit 100, according to some embodiments. The variable aperture masking unit 100 comprises a plurality of carrier tracks 101, a plurality of panel carriers 103 coupled to the carrier tracks 101, and a plurality of isolation panels 105.

The plurality of carrier tracks 101 may be formed to dimensions suitable for forming different apertures. In some embodiments, the dimensions (e.g., lengths, widths and heights) of the plurality of carrier tracks 101 may be the same; however, in other embodiments, the dimensions may be different. In an embodiment, the plurality of carrier tracks 101 may have a length $L_{101}$ between about 1 mm and about 500 mm, such as about 350 mm, may have a width $W_{101}$ between about 1 mm and about 250 mm, such as about 100 mm, and may have a height $H_{101}$ between about 1 mm and about 250 mm, such as about 100 mm. However, the plurality of carrier tracks 101 may be formed to have any suitable length, any suitable width, and any suitable height. In an embodiment, the plurality of carrier tracks 101 may be built into a quadrilateral shape in four directions with an angle θ between connected carrier tracks 101. According to an embodiment, the angle θ may be between about 0.1 degree and about 180 degrees, such as about 90 degrees.

The panel carriers 103 may be coupled to the plurality of carrier tracks 101 and each individual carrier of the panel carriers 103 may be dynamically controlled to travel along the individual track of the carrier tracks 101 to which the individual carrier is coupled. In an embodiment, the panel carriers 103 may comprise, for example, linear motors, DC/AC motors, oil/gas cylinders, electromagnets and the like to assist the panel carriers 103 in traveling along the carrier tracks 101. However, any panel carrier 103 suitable for coupling to and traveling along the carrier tracks 101 may be used.

Each panel of the plurality of isolation panels 105 spans between and is held in position by a coordinated pair of panel carriers 103 coupled to a set of carrier tracks 101 on opposing sides of the variable aperture masking unit 100. FIG. 1 further illustrates that each coordinated pair of panel carriers 103 may be dynamically controlled to move a respective isolation panel 105 of the isolation panels 105 along the corresponding set of carrier tracks 101, as indicated in FIG. 1 by the directional arrows 104. For example, each carrier track of the carrier tracks 101 may have two sets of isolation panels 105 (e.g., two pairs of sliding isolation materials). However, any suitable number of sets of isolation panels 105 may be used.

FIG. 1 also illustrates that a first set of isolation panels 105a are coupled by their respective sets of the panel carriers 103 to a first set of carrier tracks 101a and a second set of isolation panels 105b are coupled by their respective sets of the panel carriers 103 to a second set of carrier tracks 101b. The first set of isolation panels 105a may be held in a position above and in a direction substantially perpendicular to the direction of the second set of isolation panels 105b. As such, a variable mask aperture 107 is defined by edges of the isolation panels 105 that face the center of the variable aperture masking unit 100.

Furthermore, each coordinated pair of panel carriers 103 may be dynamically controlled to move a respective isolation panel of the isolation panels 105 in directions of the corresponding set of carrier tracks 101, as illustrated by the directional arrows 104 in FIG. 1. By dynamically controlling and coordinating the movements of the plurality of isolation panels 105, the size, position and shape of the variable mask aperture 107 may be modified as needed to apply one or more ion implantation processes and/or apply one or more annealing processes to a plurality of dies of a wafer using the variable aperture masking unit 100. Thus, the size, position and shape of the variable mask aperture 107 are determined by the relative positioning of the isolation panels 105. For example, the variable mask aperture 107 may have a square shape or a rectangular shape and may have a length of between about 5 μm and about 100 mm, such as about 3 mm and a width of between about 5 μm and about 100 mm, such as about 3 mm. According to a specific embodiment, the variable mask aperture 107 may be controlled to have a square shaped opening with an anneal area of between about 1 $cm^2$ and about 150 $cm^2$. As such, the variable aperture masking unit 100 may be incorporated into a system (e.g., dopant implantation systems, laser anneal systems, and the like) used to form semiconductor devices in a plurality of semiconductor dies during wafer fabrication. As such, the variable aperture masking unit 100 may be dynamically controlled by the system to define each of the diffusion areas for each of the plurality of implantation processes and/or to define each of the anneal processing areas for each of the plurality of annealing processes used to form semiconductor devices in a plurality of semiconductor dies during wafer fabrication. In embodiments, the laser range area (e.g., the size, position and shape of the variable mask aperture 107) may be selected through the positioning of the power-driven sliding materials (e.g., the plurality of isolation panels 105 spanning between and held in position by coordinated pairs of panel carriers 103). The plurality of isolation panels 105 may be positioned based on an optical ruler and/or closed loop feedback to a control unit of a tool and/or system in which the variable mask aperture 107 is incorporated.

FIG. 2A illustrates the first set of isolation panels 105a may be positioned above and separated from the second set of isolation panels 105b, for example, by a first height $H_1$. In some embodiments, the first height $H_1$ may be set to avoid generating heat and the release of negative ions due to friction between portions of adjacent panels that touch during translations of the isolation panels 105. According to some embodiments, the first height $H_1$ may be between about 0.1 mm and about 100 mm, such as about 0.1 mm and about 10 mm, such as about 5 mm. However, any suitable height may be used.

In some embodiments, the isolation panels 105 may have a square, column, or cylinder shape and may have a thickness $Th_{105}$ or diameter of between about 0.1 mm and about 20 cm, such as about 50 mm. The isolation panels 105 may comprise a series of layers (e.g., substrate, absorbance layers, anti-reflective coating layers, shielding layers, etc.) including one or more materials (e.g., quartz, metal, ceramic, plastic, stone, and graphite). However, any suitable isolation materials may be utilized for the isolation panels 105.

Figure 2B:
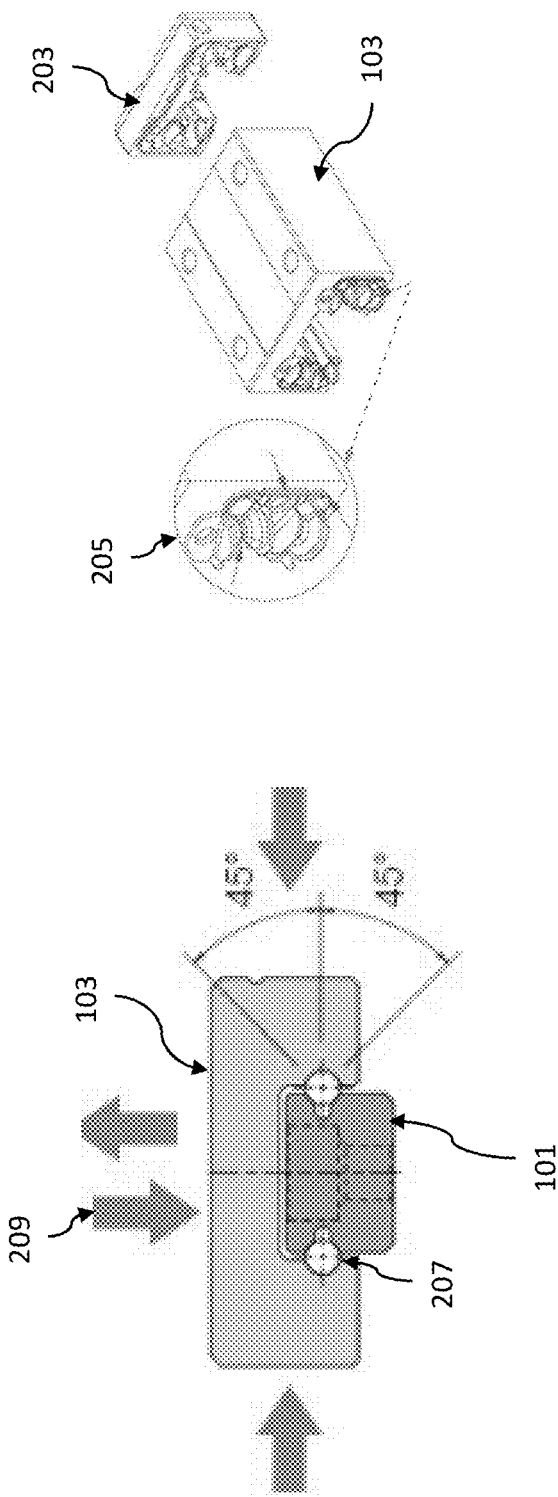
FIG. 2B illustrates details of an isolation material panel carrier of the variable aperture masking unit of FIG. 1, in accordance with some embodiments.

FIG. 2B illustrates some details of the panel carriers 103 and coupling arrangement between a panel carrier 103 and a carrier track 101, according to some embodiments. According to some embodiments, the panel carrier 103 and a cutout 203 showing some details of internal structures within the panel carrier 103 are also illustrated in FIG. 2B. The panel carrier 103 includes a plurality of dual-flanged wheel sets 205 that ride on rails 207 on opposing sides of the carrier track 101. The dual-flanged wheel sets 205 are arranged at opposing angles (e.g., 45° angles). The flanges of the wheels of the dual-flanged wheel sets 205 and the opposing angled arrangement of the dual-flanged wheel sets 205 themselves impart opposing forces 209 which keep the panel carrier 103 coupled to the carrier track 101.

Figure 3A:
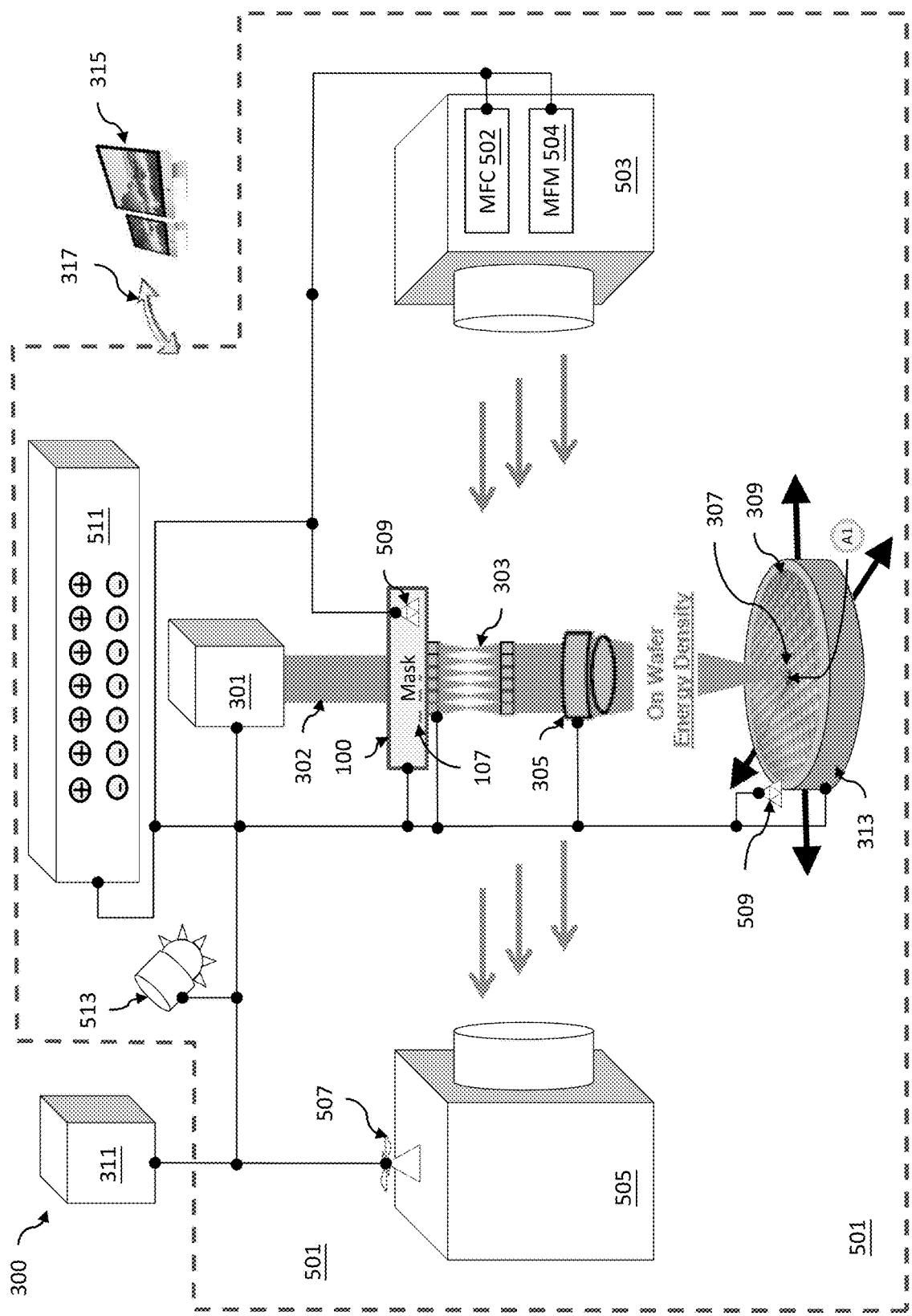
FIG. 3A illustrates a laser system comprising the variable aperture masking unit for performing an annealing process to a target die of a semiconductor wafer, according to some embodiments.

FIG. 3A illustrates a laser system 300 for performing laser processing (e.g., laser anneal processing) of a semiconductor wafer 309 in a chamber 501. In an embodiment, the laser anneal is performed on the semiconductor wafer 309 that has previously received an implantation, for example, a source/drain implantation, a lightly-doped source/drain implantation, a well implantation, or the like. During the implantation, a p-type or an n-type impurity may be implanted into a plurality of implantation regions of each die of the semiconductor wafer 309. Accordingly, implanted regions located within a first anneal processing area A1 of a target die 307 each receive the laser anneal, and hence the implanted impurity is activated in each implanted region located within the first anneal processing area A1.

In more detail, FIG. 3A illustrates the semiconductor wafer 309 during anneal processing by the laser system 300. The laser system 300 may include a laser source 301, the variable aperture masking unit 100, a plurality of optics 303, one or more optical lenses 305, a wafer handling unit 313, a plurality of sensors 509 (e.g., pressure sensors, temperature sensors, vibration sensors, and the like) and a control unit 311. During laser processing, the laser source 301, the variable aperture masking unit 100, the plurality of optics 303, the one or more optical lenses 305, and the wafer handling unit 313 may be dynamically and cooperatively controlled by the control unit 311 based on real-time feedback from the plurality of sensors 509.

In an embodiment, the anneal processing may be initiated by placing the semiconductor wafer 309, once implanted with impurities, into the laser system 300. In an embodiment the wafer handling unit 313 is a surface to which the semiconductor wafer 309 may be placed or attached to and which provides support and control to semiconductor wafer 309 during the anneal processing. Additionally, the wafer handling unit 313 may be movable along one or more axes under the command of the control unit 311 and may be controlled, for example, to arrange and align a target die 307 of the semiconductor wafer 309 into a desired position to receive the anneal processing. Furthermore, the wafer handling unit 313 may provide any desired heating or cooling to the semiconductor wafer 309 in order to prevent temperature gradients from affecting the anneal processing.

In embodiments, the laser source 301 may be provided by a scanning laser diode bar for providing a short wavelength ($\lambda$) laser (0.126 µm) or (e.g., $\lambda$=126 nm) at normal incidence. In some embodiments, the laser source 301 may be provided by a scanning carbon-dioxide ($CO_2$) laser for providing a long wavelength ($\lambda$) laser (10.6 µm) or (e.g., $\lambda$=10,600 nm) with a grazing angle ($\theta$) of incidence. However, any suitable laser annealing technology and/or techniques may be utilized.

According to some embodiments, the laser source 301 may be any suitable type of laser (e.g., excimer laser, CO2 laser, or the like) and may be configured to generate a laser beam 302 having a wavelength $\lambda$ of between about 126 nm and about 10.6 µm, such as about 308 nm and a source output energy density of between about 0.08 $J/cm^2$ and about 2 $J/cm^2$, such as about 1.4 $J/cm^2$. However, any suitable wavelength and/or suitable source output energy density may be used.

According to some embodiments, once the semiconductor wafer 309 has been placed into the laser system 300 and prior to the laser anneal processing, a wafer centering procedure may be performed by the laser system 300 to calibrate the position of the semiconductor wafer 309, to determine a center of the semiconductor wafer 309, to determine positions of an inner region of the semiconductor wafer 309, to determine a wafer-edge exclusion region of the semiconductor wafer 309 and to determine interfaces between the inner region and the exclusion region of the semiconductor wafer 309. Furthermore, the laser system 300 may initially perform power adjustments of the laser beam 302 to ensure synchronization of subsequently performed anneal processing for a target die 307 of the semiconductor wafer 309.

Once calibrated and synchronized, the laser system 300 controls the variable aperture masking unit 100 to adjust the size, position and shape of the variable mask aperture 107 to isolate the first anneal processing area A1 of the target die 307 of the semiconductor wafer 309. In order to arrange the isolation panels 105 accordingly, the variable aperture masking unit 100 adjusts the size, position and shape of the variable mask aperture 107 by directing the coordinated pairs of panel carriers 103 to move along the carrier tracks 101 to unique locations corresponding to a desired one or more size, position and shape of the variable mask aperture 107 that are associated with a desired pattern of the first anneal processing area A1.

Once the isolation panels 105 have been appropriately arranged to isolate the first anneal processing area A1, the control unit 311 may dynamically control the laser source 301 to generate the laser beam 302 with a first wavelength and with an appropriate energy density associated with a first anneal process assigned to the first anneal processing area A1. For example, the laser source 301 may emit the laser beam 302 having a first wavelength ($\lambda_1$) of between about 126 nm and about 10,600 nm, such as about 308 nm for performing the first annealing process in the first anneal processing area A1. However, any suitable wavelength may be used for the first annealing process.

The variable aperture masking unit 100 is located between the laser source 301 and the semiconductor wafer 309 in order to form a desired pattern in the laser beam 302 and to block portions of the laser beam 302 from actually impinging upon the semiconductor wafer 309. In some embodiments, the isolation panels 105 of the variable aperture masking unit 100 comprise a series of layers to reflect, absorb, or otherwise block portions of the laser beam 302 from reaching those portions of the target die 307 that lie outside of the first anneal processing area A1 and which are not desired to be annealed during the first annealing process. In some embodiments, as the laser beam 302 impinges on the variable aperture masking unit 100, at least a portion of the laser beam 302 passes through the variable mask aperture 107 in the desired patterned form to the optics 303 of the laser system 300. The portions of the laser beam 302 that do not pass through the variable mask aperture 107 are blocked, by the materials of the isolation panels 105, from passing through to the optics 303. As such, the blocked portions of the laser beam 302 fail to reach those portions of the target die 307 that lie outside of the first anneal processing area A1.

The optics 303 may be used to concentrate, expand, reflect, or otherwise control the portion of the laser beam 302 that passes through the variable mask aperture 107 and is directed towards the target die 307 of the semiconductor wafer 309. In an embodiment, the optics 303 comprise one or more lenses, mirrors, filters, combinations of these, or the like to control the laser beam 302 along its path. Additionally, while the optics 303 are illustrated in FIG. 3A as being between the variable mask aperture 107 and the semiconductor wafer 309, elements of the optics 303 (e.g., individual lenses, mirrors, etc.) may also be located at any location between the laser source 301 (where the laser beam 302 is generated) and the semiconductor wafer 309.

Once passed through the optics 303, the laser beam 302 may further pass through one or more optical lenses 305, according to some embodiments. The optical lenses 305 may be controlled by the control unit 311 to focus the laser beam 302 in the desired patterned form with a desired on-wafer energy density onto the first anneal processing area A1 of the target die 307. During the first anneal process, the control unit 311 may dynamically and cooperatively control one or more of the laser source 301, the variable aperture masking unit 100, the optics 303, the optical lenses 305 and the wafer handling unit 313 in order to project the laser beam 302 in a desired patterned form onto a desired location within the first anneal processing area A1 of the target die 307 of the semiconductor wafer 309.

In order to activate the impurities implanted within the materials of the semiconductor wafer 309 at the desired location, the control unit 311 may further control the laser system 300 to deliver the laser beam 302 in the desired patterned form and having a desired on-wafer energy density for a desired period of time. As such, according to the first anneal process, an on wafer temperature of the materials of the semiconductor wafer 309 at the desired location is raised to a desired anneal temperature for a desired period of time. For example, the laser system 300 may be controlled to deliver the laser beam 302 in the patterned form to the first desired location with an on-wafer energy density of between about 0.08 J/cm$^2$ and about 2 J/cm$^2$, such as about 1.4 J/cm$^2$. However, any suitable on-wafer energy density may be used to perform the first annealing process. Furthermore, the laser system 300 may be controlled to raise the on-wafer temperature of the materials of the semiconductor wafer 309 in the first desired location to an anneal temperature of between about 300° C. and about 1200° C., such as about 900° C. for a period of time between about 100 ns and about 2 ms, such as about 180 ns. However, any suitable anneal temperature and any suitable period of time may be used to perform the first annealing process.

Once the impurities have been activated in the first desired location, the control unit 311 may dynamically control one or more of the laser source 301, the variable aperture masking unit 100, the optics 303, the optical lenses 305 and the wafer handling unit 313, in order to perform a second anneal process in a second desired location. In some embodiments, the second anneal process may be the same as the first anneal process and in other embodiments the second anneal process may be different from the first anneal process. Furthermore, according to some embodiments, the second desired location may be within the first anneal processing area A1 of the target die 307 of the semiconductor wafer 309. In other embodiments, the second desired location may be within a different anneal processing area of the target die 307 or may be within a different anneal processing area of a different target die of the semiconductor wafer 309.

FIG. 3A further illustrates that the laser system 300 may operate within confines of the chamber 501 (e.g., vacuum chamber, implantation chamber, annealing chamber, deposition chamber, or the like) for controlling the environment of the laser system 300 and the semiconductor wafer during processing. The chamber 501 may be utilized to perform one or more of the ion implantation and/or annealing processes according to some embodiments disclosed herein. In an embodiment, the chamber 501 additionally comprises a mass flow unit 503, a vacuum pumping system 505, one or more of the sensors 509, an ion generator 511 and one or more heating elements 513.

The mass flow unit 503 may comprise a mass flow controller (MFC) 502 and/or a mass flow meter (MFM) 504 to control a flow rate of gases (e.g., $N_2$, He, Ar, CDA, Air, $O_2$, $CO_2$ and $N_2O$) used during the implantation and annealing processes. According to some embodiments, the gases that are released into the chamber 501 may be safe to use on the surfaces of the variable aperture masking unit 100. Therefore, the variable aperture masking unit 100 may be used in various implantation and annealing processes without concern of undesired effects (e.g., undue corrosion and/or pitting) on the surfaces of the variable aperture masking unit 100 during operation. In an embodiment, the mass flow unit 503 may be dynamically controlled by the control unit 311 to adjust the flow rate of the gases during operation. According to an embodiment, the flow rate of the gases may be controlled during the first annealing process associated with the first anneal processing area A1 to be between about 10 sccm and about 200 slm, such as about 50 slm.

The vacuum pumping system 505 may comprise one or more pumps (e.g., "roughing" pumps, turbomolecular pumps, cryogenic pumps, regenerative pumps, and the like) to generate suitable pressures within the chamber 501 during different stages of operation and according to a particular recipe of wafer fabrication and/or the series of steps in developing the material makeup and structure of the semiconductor wafer. The vacuum pumping system 505 is configured to purge gases from the chamber 501 and may also comprise a throttle valve 507 that may be dynamically controlled by the control unit 311 to adjust a vacuum exhaust pressure within the chamber 501 and to isolate the chamber 501 during the different stages of operation in order to expel exhaust gases from the chamber 501.

In addition, the throttle valve 507 may also provide feedback to the control unit 311 in real-time. As such, the control unit 311 may control the vacuum pumping system 505 to adjust the vacuum exhaust pressure of the chamber 501 to be maintained at constant operating pressures according to the wafer fabrication recipe. For example, the throttle valve 507 may be dynamically controlled by the control unit 311 to adjust the pressure of the vacuum pumping system 505 during the implantation and/or the anneal processing in order to isolate the chamber 501 and/or to maintain the vacuum exhaust pressure of the chamber 501 between about −0.1 Pa and about −900 kPa or between about −400 kPa and about 120 kPa, such as about −1.2 kPa.

The ion generator 511 may be used to generate positive ions to offset negative ions (created on, e.g., the variable aperture masking unit 100 during the processing) in ambient conditions of the chamber 501 and to generate negative ions to offset positive ions (created on, e.g., the variable aperture masking unit 100 during the processing) in ambient conditions of the chamber 501. In an embodiment, the ion generator 511 may be controlled by the control unit 311 during operation to generate between about 0v and about 20 Kv of positive ions and/or to generate between about −0v and about −20 Kv of negative ions.

The one or more heating elements 513 may be used to regulate the ambient temperature within the chamber 501 and the localized temperature of the semiconductor wafer 309, according to the wafer fabrication recipe. In an embodiment, the control unit 311 may control the one or more heating elements 513 to regulate the temperature within the chamber 501 during operation to a temperature of between about −20° C. and about 500° C., such as about 200° C.

Furthermore, the control unit 311 may use real-time feedback during operation to dynamically control one or more of the laser source 301, the variable aperture masking unit 100, the optics 303, the optical lenses 305, the wafer handling unit 313, the mass flow unit 503, the throttle valve 507 and the vacuum pumping system 505, the ion generator 511 and/or the one or more heating elements 513. In some embodiments, the control unit 311 may use the real-time feedback in order to strictly regulate the conditions of the chamber 501 and to balance the forces, the ion charges, and/or the temperatures imparted to the variable aperture masking unit 100 and the semiconductor wafer 309 during processing.

In an embodiment, the sensors 509 may be arranged within the chamber 501 at desired locations in order to communicate real-time feedback to the control unit 311. For example, a vibration sensor and/or a pressure sensor may be arranged on or proximate one or more of the isolation panels 105, the panel carriers 103, and/or the carrier tracks of the variable aperture masking unit 100. The sensors 509 may provide real-time feedback to the control unit 311 of vibrations and/or pressures imparted to the variable aperture masking unit 100, for example, due to a current flow rate of the gases and/or due to a current vacuum exhaust pressure within the chamber 501. As such, the control unit 311 may control the mass flow controller 502 of the mass flow unit 503 to adjust the flow rate of the gas and/or control the throttle valve 507 of the vacuum pumping system 505 to adjust the vacuum exhaust pressure. For example, the flow rate of the gas and/or the vacuum exhaust pressure may be adjusted in order to ensure the size, the position and the shape of the variable mask aperture 107 are maintained during processing and to ensure accurate delivery of the laser beam 302 in the desired patterned form onto the first anneal processing area A1 of the target die 307.

The one or more sensors 509 (e.g., temperature sensors) being located at or on one of the plurality of isolation panels 105 to sense a temperature of the isolation panels 105 and provide feedback to the control unit 311 of temperatures of one or more sliding objects (e.g., the isolation panels 105 and/or the panel carriers 103). In one embodiment, a sensor 509 may be attached to a backside of one or more of the isolation panels 105 in order to sense a temperature of the isolation panels 105 during the first anneal process associated with the first anneal processing area A1. The control unit 311 uses the feedback from the sensors 509 to control a temperature of the sliding objects between about −20° C. and about 500° C., such as about 250° C.

The control unit 311 is used to control the operating parameters of the laser system 300 during operation. The control unit 311 may be implemented in either hardware or software, and the parameters may be hardcoded or fed into the control unit 311 through an input port. The control unit 311 may be used to store and control parameters associated with the operation of the laser system 300, such as the desired laser beam wavelengths ($\lambda$), laser source energy densities ($J/cm^2$), coordinates of panel carriers, aperture and anneal processing area parameters (e.g., sizes, positions and shapes), on-wafer energy densities ($J/cm^2$), temperatures, time periods, associations there between, and the like. Additionally, the control unit 311 may also be used to control the wafer handling unit 313 and, more specifically, the velocity of the motors of the wafer handling unit 313, which, in turn, control the velocity of the semiconductor wafer 309 with respect to the laser beam 302.

Figure 3B:
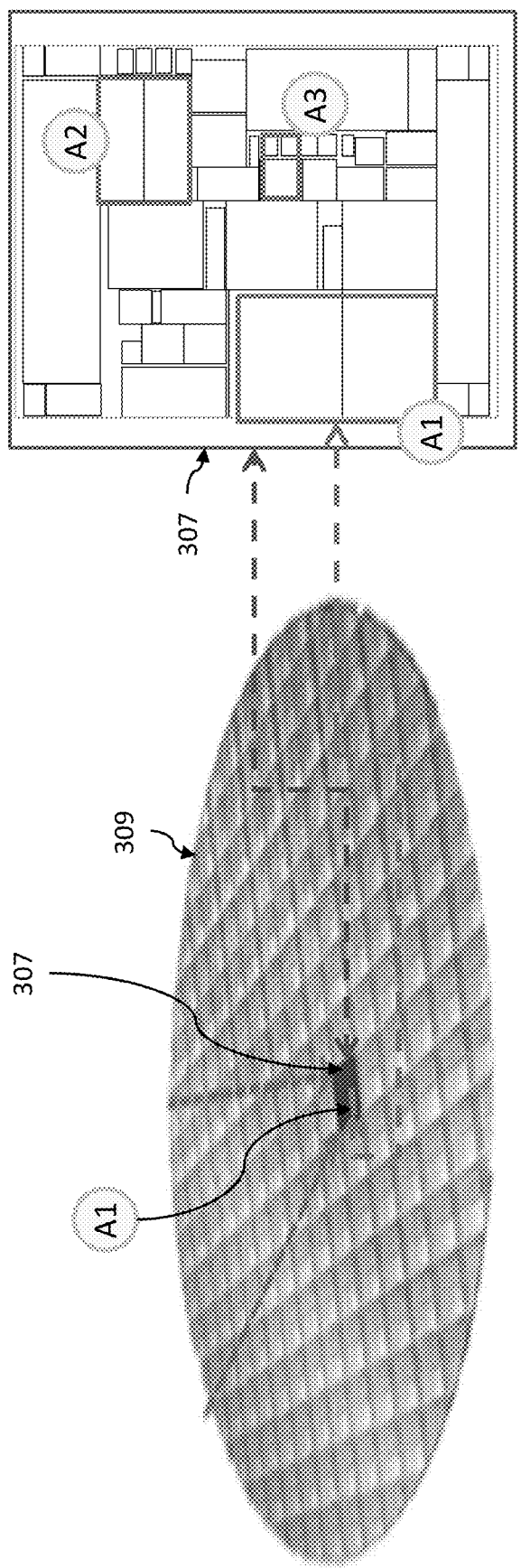
FIG. 3B illustrates a detailed view of the semiconductor wafer and examples of anneal processing areas of the target die as defined and utilized by the laser system of FIG. 3A, according to some embodiments.

FIG. 3B illustrates the target die 307 of the semiconductor wafer 309, according to some embodiments, comprising a plurality of anneal processing areas, for example, including the first anneal processing area A1, a second anneal processing area A2 and a third anneal processing area A3. The size, position and shape of the variable mask aperture 107 may be dynamically controlled by the control unit 311 to isolate each anneal processing area A1, A2 and A3 of each target die 307 as dictated by a corresponding anneal process recipe associated with each anneal processing area. In some embodiments, the size of the first anneal processing area A1 may be between about 0.1 $cm^2$ and about 0.9 $cm^2$, such as about 0.5 $cm^2$; the size of the second anneal processing area A2 may be between about 0.01 $cm^2$ and about 0.09 $cm^2$, such as about 0.05 $cm^2$; and the size of the third anneal processing area A3 may be between about 0.001 $cm^2$ and about 0.009 $cm^2$, such as about 0.005 $cm^2$. However, any suitable size may be used.

In some embodiments, the control unit 311 may dynamically control the laser source 301, the optics 303, the optical lenses 305 to scan and move the laser beam 302 impinging on the target die 307 across a plurality of scan points within an anneal processing area while dynamically controlling the power associated with an anneal process corresponding to a current isolated processing area (e.g., the first anneal processing area A1) of the target die 307. Furthermore, the dynamic control of the scanning and the dynamic control of the power of the laser source may be based on real-time sensing and real-time feedback from sensors 509 at or on the variable aperture masking unit 100 and/or at or on the semiconductor wafer 309.

In some embodiments, a plurality of laser beams 302 may be projected by the laser source 301 onto one or more portions of one or more of the anneal processing areas A1, A2 and A3 of a target die 307 on a surface of the semiconductor wafer 309. The semiconductor wafer 309 may be scanned by laser beam 302, which is projected on the surface of the semiconductor wafer 309 in a plurality of passes according to some embodiments.

During a pass, the laser beam 302 may anneal at least a portion of one or more of the anneal processing areas A1, A2 and A3 at a time. According to some embodiments, in a pass of the laser anneal, laser beam 302 moves from one end of the semiconductor wafer 309 to an opposite end of the semiconductor wafer 309, performing an anneal process for each portion of an anneal processing area A1, A2 and/or A3 of each target die 307 that the laser beam 302 encounters during the pass. According to an embodiment, in a pass of the laser anneal, the laser beam 302 moves from one end of a first anneal processing area (e.g., left side of anneal processing area A1) of the target die 307 to an opposite end of the first anneal processing area (e.g., right side of anneal processing area A1) of the target die 307 and continues to move across the first anneal processing area until the entire processing area (e.g., anneal processing area A1) of the target die 307 has been annealed, prior to moving to another anneal processing area (e.g., anneal processing area A3) of the target die 307 and prior to moving to another die of the semiconductor wafer 309. However, any suitable scanning process may be used.

Under control of the control unit 311, the isolation panels 105 may be re-positioned and arranged to isolate a second anneal processing area (e.g., anneal processing area A2 of the target die 307). Once the isolation panels 105 have been arranged to isolate the second anneal processing area A2, the laser source 301 may be dynamically controlled by the control unit 311 to generate the laser beam 302 and to provide the appropriate power associated with a second anneal process corresponding to the second anneal processing area A2. In some embodiments, the control unit 311 may dynamically control the laser source 301, the optics 303, the optical lenses 305 and the power of the laser source 301 to scan and move the laser beam 302 within the second anneal processing area A2 with an anneal process corresponding to the second anneal processing area A2. In some embodiments, the control unit 311 may dynamically control the second anneal processing within the second anneal processing area A2 based on real-time sensing and real-time feedback from the sensors 509.

Under control of the control unit 311, the isolation panels 105 may be re-positioned and arranged to isolate a third anneal processing area (e.g., anneal processing area A3 of the target die 307). Once the isolation panels 105 have been arranged to isolate the third anneal processing area A3, the laser source 301 may be dynamically controlled by the control unit 311 to generate the laser beam 302 and to provide the appropriate power associated with a third anneal process corresponding to the third anneal processing area A3. In some embodiments, the control unit 311 may dynamically control the laser source 301, the optics 303, the optical lenses 305 and the power of the laser source 301 to scan and move the laser beam 302 within the third anneal processing area A3 with an anneal process. In some embodiments, the control unit 311 may dynamically control the third anneal processing within the third anneal processing area A3 based on real-time sensing and real-time feedback from the sensors 509.

In an embodiment, the laser system 300 may be configured to control the variable mask aperture 107 to sequentially perform a series of three annealing processes for the three anneal processing areas A1, A2, and A3 for a current target die (e.g., target die 307) before moving to a next die to perform the series of three annealing processes on the next die, thereby dynamically controlling the laser power and the variable mask aperture 107 to shoot different areas with different power densities. In some embodiments, the system may also dynamically control the power of the laser and/or the "on-wafer energy density" for each of the annealing processes for the three anneal processing areas A1, A2 and A3. In some embodiments, the control unit 311 may control the energy density in each of the annealing processes to first, second and third energy densities corresponding to the three anneal processing areas A1, A2 and A3. For example, the first energy density may be controlled to be 1.2 J/cm² for the first annealing process performed in the first anneal processing area A1; the second energy density may be controlled to be 0.5 J/cm² for the second annealing process performed in the second anneal processing area A2 and the third energy density may be controlled to be 0.8 J/cm² for the third annealing process performed in the third anneal processing area A3.

In other embodiments, the laser system 300 may be configured to perform a series of first annealing processes for the first anneal processing areas A1 on each target die 307 of the plurality of semiconductor dies of the semiconductor wafer 309 before performing a series of second anneal processes on the semiconductor wafer 309. Once the series of first annealing processes have been performed, the laser system 300 may be configured to perform the series of second annealing processes for the second anneal processing areas A2 on each target die 307 of the plurality of semiconductor dies of the semiconductor wafer 309 before performing a series of third anneal processes on the semiconductor wafer 309. Once the series of second annealing processes have been performed, the laser system 300 may be configured to perform the series of third annealing processes for the third anneal processing areas A3 on each target die 307 of the plurality of semiconductor dies of the semiconductor wafer 309. However, any suitable number of annealing processes and any order of performing the annealing processes may be performed.

The variable aperture masking unit 100 controls the anneal area by dynamically moving the isolation panels 105 and may control the size, position and shape of an anneal processing area to fit the demand of many advanced device diffusion processes. For example, the variable aperture masking unit 100 allows for reduced pattern loading effect during processing, allows for die by die defining of laser thermal areas and for laser energy tuning during wafer fabrication, and eliminates and/or avoids unnecessary annealing of undesirable areas. As such, stitching effects are reduced by the variable aperture masking unit 100 during anneal processing. The variable aperture masking unit 100 enables customized anneal processing to be based on production layout of the dies such that "hot edges" may be arranged only on the "scrubber line" and/or may be arranged only on areas of the wafer that are not functional (e.g., scribe lines, production loss edge dies, and the like). Furthermore, the variable aperture masking unit 100 allows for mask usage savings while still providing specific areas to anneal.

Figure 4A:
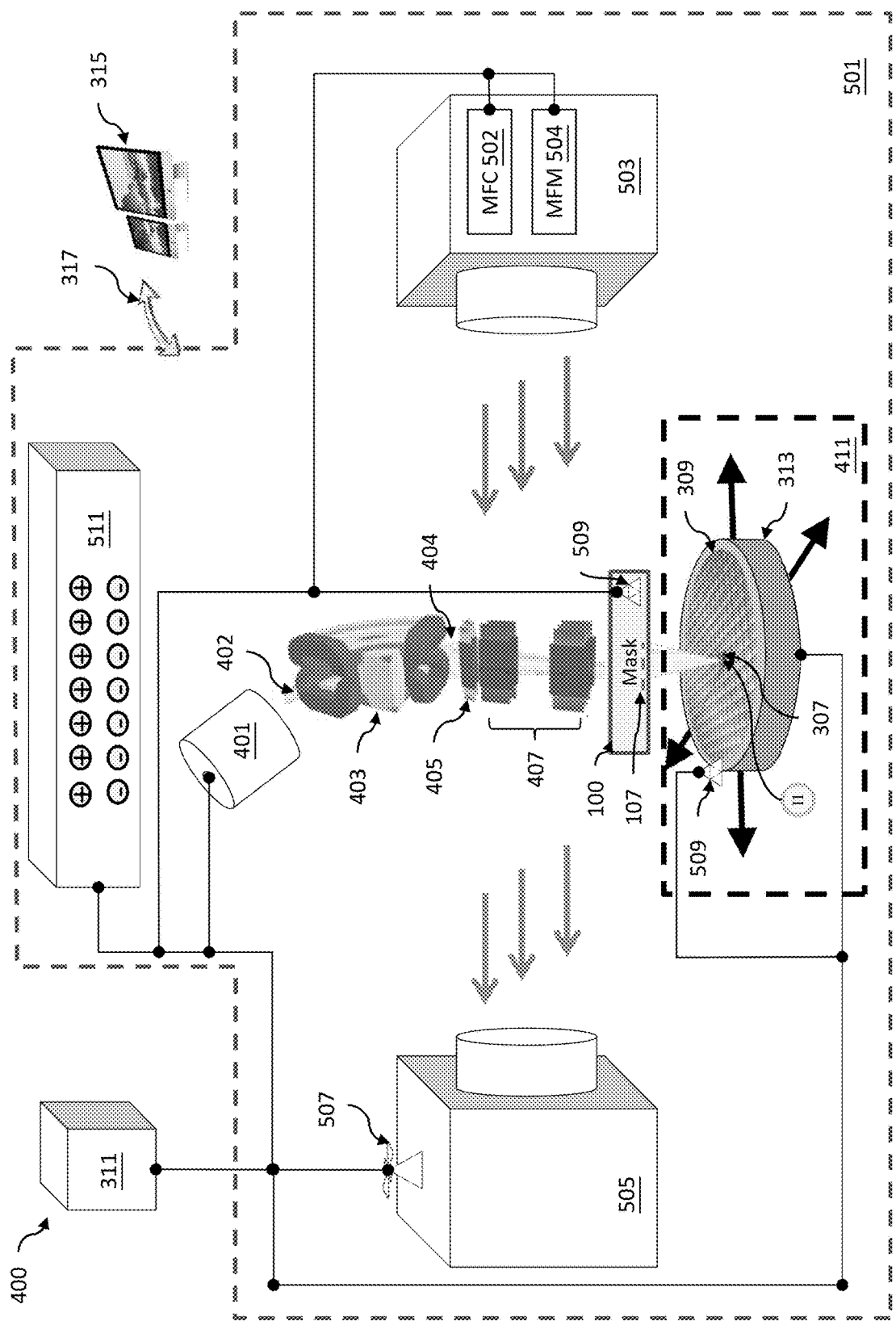
FIG. 4A illustrates a dopant implantation processing system comprising the variable aperture masking unit for performing a dopant implantation in the target die of the semiconductor wafer, according to some embodiments.

FIG. 4A illustrates a dopant implantation system 400 which utilizes the variable aperture masking unit 100 to implant n-type and p-type dopants. The dopant implantation system 400 may include an ion source 401, a mass analysis magnet 403, a linear accelerator 405, a convergence unit 407, an aperture 409, and an end station 411 including the variable aperture masking unit 100 and the wafer handling unit 313. The dopant implantation system 400 may be controlled by the control unit 311 to dynamically control dopant implantation process, control the size, position and shape of the variable mask aperture 107 of the variable aperture masking unit 100, and provide real-time sensing and control of the implantation process of the diffusion area based on real-time feedback from sensors at or on the variable aperture masking unit 100 and/or the wafer handling unit 413. According to embodiments disclosed herein, the dopant implantation system 400 operates within confines of the chamber 501.

The ion source 401 produces an ion beam 402. However, as the ion source 401 produces ions having a range of charge-to-mass ratio, and only a certain range of ions are suitable for implantation, the ion beam 402 is directed towards the mass analysis magnet 403 in order to electromagnetically separate those ions having a desired charge-to-mass ratio for implantation from those ions having an undesired charge-to-mass ratio. Once a coherent ion beam 404 of suitable charge-to-mass ratio is obtained, the coherent ion beam 404 is sent to the linear accelerator 405.

The linear accelerator 405 is used to impart additional energy to the coherent ion beam 404 as it passes through the linear accelerator 405. The linear accelerator 405 imparts this additional energy using a series of electrodes that generate an electromagnetic field which, when the coherent ion beam 404 passes through the field, works to accelerate the coherent ion beam 404. The linear accelerator 405 may vary the electromagnetic fields periodically with time or may adjust the phase of the electromagnetic fields to accommodate ions with different atomic numbers as well as ions having different initial speeds.

After the coherent ion beam 404 is passed through the linear accelerator 405, the coherent ion beam 404 is passed through the converging unit 407, which is utilized to modify the convergence and divergence of the coherent ion beam 404 (which arrives from the linear accelerator 405 as a substantially parallel beam). In an embodiment the converging unit 407 comprises one or more (such as three) multipole lenses, such as a uniformity multipole lens and a collimator multipole lens. However, any suitable number and type of lenses may be utilized.

The variable aperture masking unit 100 may be utilized between the converging unit 407 and the end station 411. In an embodiment, the variable aperture masking unit 100 is utilized to direct and bend the path of the coherent ion beam 404 to the desired finalized location, for example, the coherent ion beam 404 may be projected onto a first implantation area I1 of the target die 307.

Once the coherent ion beam 404 has been accelerated (through the linear accelerator 405) and the divergence of the coherent ion beam 404 has been modified (through the convergence unit 407), the coherent ion beam 404 is directed towards the end station 411. The end station 411 may house the wafer handling unit 313, which handles the semiconductor wafer 309 which is implanted with ions from the coherent ion beam 404. The wafer handling unit 313 is utilized to move the semiconductor wafer 309 in relation to the coherent ion beam 404 so as to illuminate different implantation areas of the plurality of dies of the semiconductor wafer 309 with the coherent ion beam 404. For example, the wafer handling unit 313 may comprise motors which may be used to control the position of the semiconductor wafer 309 in at least two directions, such as an x-direction and a y-direction, relative to the coherent ion beam 404.

The control unit 311 is used to control the operating parameters of the dopant implantation system 400 during operation. The control unit 311 may be implemented in either hardware or software, and the parameters may be hardcoded or fed into the control unit 311 through an input port. The control unit 311 may be used to store and control parameters associated with the operation of the dopant implantation system 400, such as the desired ion beam current, the current to the accelerator electrodes, and the like. Additionally, the control unit 311 may also be used to control the wafer handling unit 313 and, more specifically, the velocity of the motors of the wafer handling unit 313, which, in turn, control the velocity of the semiconductor wafer 309 with respect to the coherent ion beam 404.

Figure 4B:
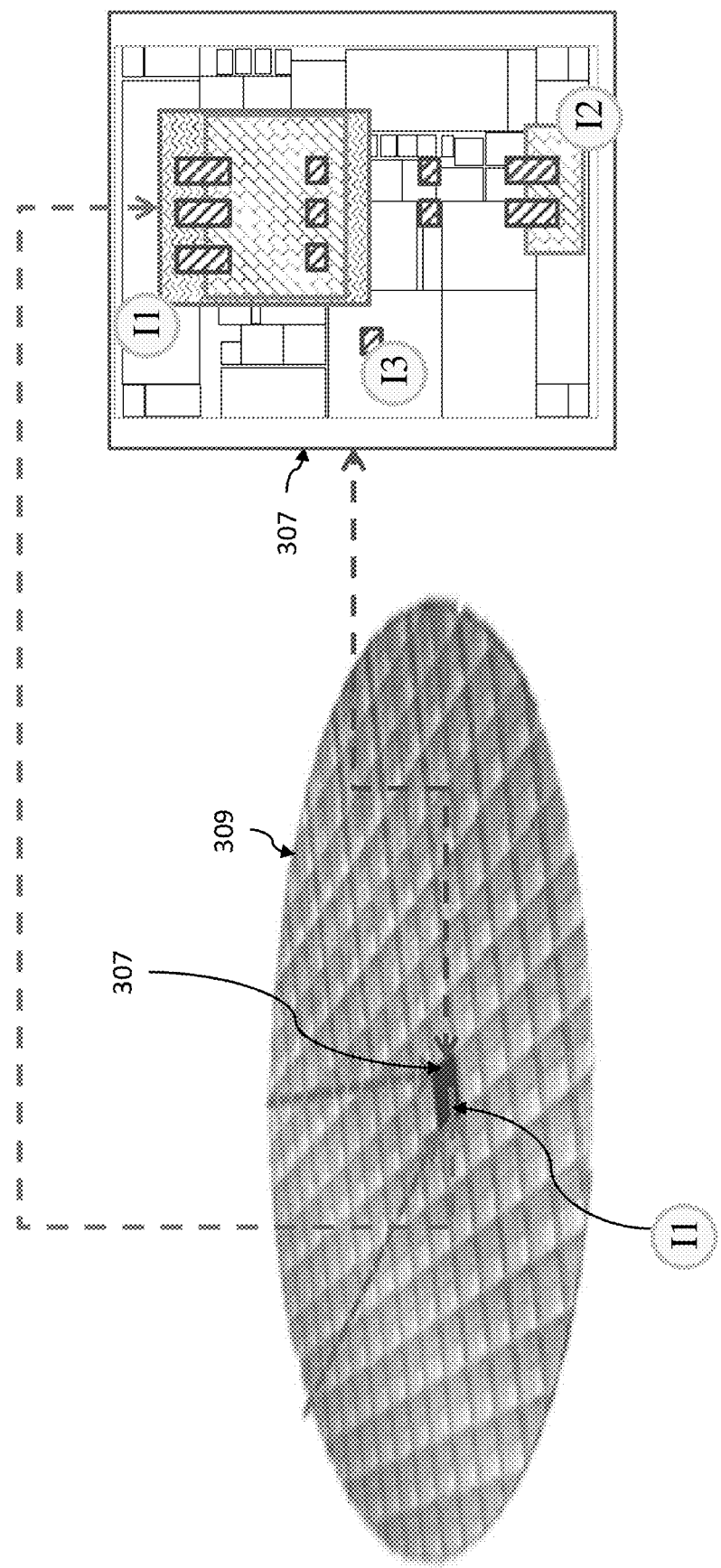
FIG. 4B illustrates a detailed view of the semiconductor wafer and examples of dopant implant processing areas of the target die as defined and utilized by the dopant implantation processing system of FIG. 4A, according to some embodiments.

FIG. 4B illustrates the semiconductor wafer 309 including the target die 307 comprising a plurality of implantation areas including the first implantation area I1, a second implantation area I2, and a third implantation area I3, according to an embodiment. The first implantation area I1 includes a single region of the target die 307 to be isolated by the variable mask aperture 107. The second implantation area I2 includes a plurality of regions (e.g., two regions) of the target die 307 to be isolated by the variable mask aperture 107. The third implantation area I3 includes a plurality of regions (e.g., eleven regions) of the target die 307 to be isolated by the variable mask aperture 107. As such, the control unit 311 may control the operating parameters of the dopant implantation system 400 during operation to isolate a portion of each region and perform a series of implantations within an implantation region in order perform a complete implantation of an implantation area. In some embodiments, the control unit 311 may control the operating parameters of the dopant implantation system 400 during operation to separately isolate and perform a series of the second dopant implantation processes to perform the second dopant implant in the plurality of implantation regions of the second isolation area I2. In some embodiments, the control unit 311 may control the operating parameters of the dopant implantation system 400 during operation to separately isolate and perform a series of the third dopant implantation in the plurality of implantation regions of the third isolation area I3.

In some embodiments, the control unit 311 may control the operating parameters of the dopant implantation system 400 to perform a series of the first implantation processes associated with the first implantation area I1 of each target die 307 of the semiconductor wafer 309, before performing the second implantation process. Once the series of first implantations are completed, the control unit 311 may control the operating parameters of the dopant implantation system 400 to perform a series of the second implantation processes associated with the second implantation areas I2 of each target die 307 of the semiconductor wafer 309, before performing the third implantation process. Once the series of second implantations are completed, the control unit 311 may control the operating parameters of the dopant implantation system 400 to perform a series of the third implantation processes associated with the third implantation areas I3 of each target die 307 of the semiconductor wafer 309. However, any suitable series of first implantation processes, second implantation processes, and third implantation processes may be performed on the semiconductor wafer 309.

Figures 5A, 5B, 5C, 5D, 5E:
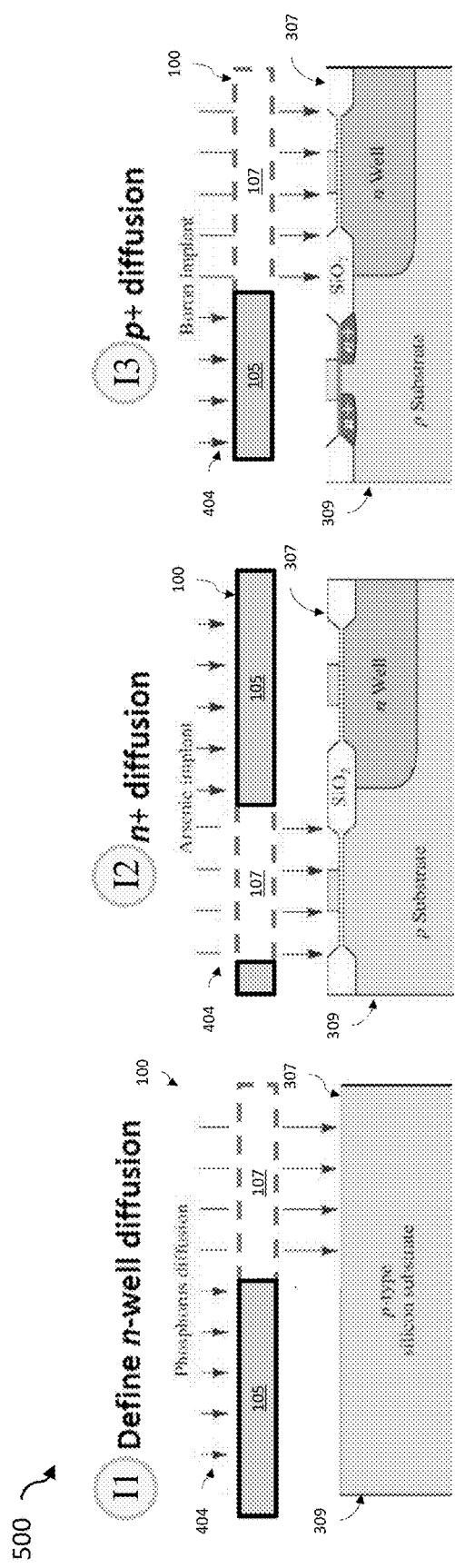
FIGS. 5A-5E illustrate several dopant implantation processes performed by the dopant implantation processing system of FIG. 4A, in accordance with some embodiments.

With reference now to FIGS. 4A-4B and with reference to FIG. 5A, in order to implant a first dopant (e.g., phosphorous diffusion) in the first implantation area I1, the semiconductor wafer 309 is placed on the wafer handling unit 313, the variable mask aperture 107 of the variable aperture masking unit 100 is controlled to isolate the first implantation area I1, and the coherent ion beam 404 is generated.

Additionally, the dopant implantation process used in the first implantation area I1 may be performed at an energy level that allows for an implantation of the first dopants (e.g., phosphorous diffusion) in order to define an n-well diffusion into a substrate (e.g., p-type silicon substrate) of the target die 307. For example, in an embodiment the first dopant implantation process used in the first implantation area I1 may be performed at an energy level between about 1 K eV and about 100 K eV, such as about 10 K eV. However, any suitable implantation energy level may be utilized.

FIG. 5B illustrates the implantation of a second dopant in the second implantation area I2. Once the first dopant implantation process is performed in the first implantation area I1, the control unit 311 may control the ion source 401 to generate the ion beam 402, control the mass analysis magnet 403 to generate the coherent ion beam 404 from the ion beam 402, and control the variable mask aperture 107 of the variable aperture masking unit 100 to isolate the second implantation area I2.

Additionally, the dopant implantation process used in the second implantation area I2 may be performed at an energy level that allows for an implantation of the second dopants (e.g., arsenic implant) in order to provide n+ diffusion into the substrate (e.g., p-type silicon substrate) of the target die 307. For example, in an embodiment the second dopant implantation process used in the second implantation area I2 may be performed at an energy level between about 100 eV and about 10 K eV, such as about 1 K eV. However, any suitable implantation energy level may be utilized.

In an embodiment, a portion of a semiconductor fin may be formed within the second implantation area I2 of the substrate (e.g., in a gate region of a FinFET device). After the second dopant implantation process has been performed and prior to being subjected to anneal processing, the semiconductor fin may have a first concentration of the second dopant (e.g., arsenic implant) along a sidewall of the fin, the first concentration of the second dopant being less than about $5.5E^{19}$. In an embodiment, the first concentration of the second dopant (e.g., arsenic), as measured by scanning electron microscope tools (SEMS), may be less than about $1E^{19}$ atomic/cm$^3$, such as about $1E^{11}$ atomic/cm$^3$, along the sidewall of the fin (e.g., in the gate region of the FinFET device). After being subject to anneal processing, the semiconductor fin may have a second concentration of the second dopant (e.g., arsenic implant) along the sidewall of the semiconductor fin. In an embodiment, the second concentration of the second dopant (e.g., arsenic) may be less than about $1E^{19}$ atomic/cm$^3$, such as about $1E^{12}$ atomic/cm$^3$, along the sidewall of the fin (e.g., in the gate region of the FinFET device).

FIG. 5C illustrates the implantation of a third dopant in the third implantation area I3. Once the second dopant implantation process is performed in the second implantation area I2, the control unit 311 may control the ion source 401 to generate the ion beam 402, control the mass analysis magnet 403 to generate the coherent ion beam 404 from the ion beam 402, and control the variable mask aperture 107 of the variable aperture masking unit 100 to isolate the rest of the wafer 309 from the third implantation area I3 (whereby the third implantation area I3 was previously masked and only released during the current implantation). As such, the variable aperture masking unit 100 is used to expose the third implantation area I3 and isolate the rest of the semiconductor wafer 309, including the first implantation areas I1 and the second implantation areas I2, from the third implantation area I3 during implantation of the third dopant in the third implantation area I3 of the target die 307. As such, the dopant size will be smaller than the variable masking unit 100, causing other portions of the wafer 309 to be isolated as well during the implantation.

Additionally, the dopant implantation process used in the third implantation area I3 may be performed at an energy level that allows for an implantation of the third dopants (e.g., boron implant) in order to provide p+ diffusion into the substrate (e.g., p-type silicon substrate) of the target die 307. For example, in an embodiment the third dopant implantation process used in the third implantation area I3 may be performed at an energy level between about 1 K eV and about 100 K eV, such as about 10 K eV. However, any suitable implantation energy level may be utilized.

In an embodiment, a portion of another semiconductor fin may be formed within the third implantation area I3 of the substrate (e.g., the gate region of the FinFET device). After the third dopant implantation process has been performed and prior to being subjected to anneal processing, the another semiconductor fin may have a first concentration of the third dopant (e.g., boron implant) along the sidewall of the fin, the first concentration of the third dopant being less than about $5.5E^{19}$. In an embodiment, the first concentration of the third dopant (e.g., boron), as measured by scanning electron microscope tools (SEMS), may be less than about $1E^{19}$ atomic/cm$^3$, such as about $1E^{13}$ atomic/cm$^3$, along the sidewall of the fin (e.g., in the gate region of the FinFET device). After being subject to anneal processing, the other semiconductor fin may have a second concentration of the third dopant (e.g., boron implant) along the sidewall of the other semiconductor fin. In an embodiment, the second concentration of the third dopant (e.g., boron), as measured by scanning electron microscope tools (SEMS), may be less than about $1E^{19}$ atomic/cm$^3$, such as about $1E^{13}$ atomic/cm$^3$, along the sidewall of the fin (e.g., in the gate region of the FinFET device).

FIGS. 5A-5E illustrates several steps using the variable masking unit 100 in the manufacturing of a semiconductor device 517, according to some embodiments. Initially, as illustrated in FIG. 5A, the coherent ion beam 404 of a first ion beam is passed through the variable mask aperture 107 and is projected onto the semiconductor wafer 309 in the first implantation area I1 of the target die 307 in order to form an n-well in a p-type substrate of the target die 307 of the semiconductor wafer 309. Once deposition and patterning of an SiO$_2$ layer and a polysilicon gate layer are performed, as illustrated in FIG. 5B, the coherent ion beam 404 of a second ion beam is passed through the variable mask aperture 107 and is projected onto the semiconductor wafer 309 in the second implantation area I2 of the target die 307 in order to form n+ diffusion areas in the p-type substrate. After the n+ diffusion areas are formed, as illustrated in FIG. 5C, the coherent ion beam 404 of a third ion beam is passed through the variable mask aperture 107 and is projected onto the semiconductor wafer 309 in the third implantation area I3 of the target die 307 in order to form p+ diffusion areas in the n-well and p-type substrate. Once the p+ diffusion areas have been formed, as illustrated in FIGS. 5D and 5E, contacts of source/drain regions of one or more transistors of the semiconductor device 517 may be formed by performing one or more deposition and patterning processes of an oxide layer and a metallization layer.

In particular, FIG. 5D illustrates a cross-section view of the semiconductor device 517 including contacts of source/drain regions of two transistors of the semiconductor device 517, according to some embodiments. The cross-section view of the semiconductor device 517 is annotated to indicate the implantation areas I1, I2, and I3 associated with the n-well region, n+ regions, and p+ regions. In addition, a top down view of the semiconductor device 517 formed in the target die 307 of the semiconductor wafer 309 is illustrated in FIG. 5E. The top-down view of the semiconductor device 517 is also annotated to indicated the implantation areas I1, I2, and I3 associated with the n-well region, n+ regions, and p+ regions.

FIGS. 5A-5E further illustrate embodiments directed towards processes for performing dopant implantations (e.g., ion implantation) in the first, second and third implantation areas I1, I2, and I3. These implantation processes may include, but are not limited to: defining n-well diffusion areas, n+ diffusion areas, and/or p+ diffusion areas in order to form source and drain regions of one or more transistors in each target die 307 of the semiconductor wafer 309. For example, source and drain regions of the transistors may be formed by implanting p-type or n-type impurities during dopant implantation processing of semiconductor wafers.

In some embodiments, the n-well diffusion may be achieved by a phosphorus diffusion process in a p-type silicon substrate, the n+ diffusion may be achieved by an arsenic implant in the p-type silicon substrate, and the p+ diffusion may be achieved by a boron implant in the p-type silicon substrate. However, any other suitable diffusions processes and/or any other suitable implant processes may be used to achieve the n-well diffusion, the n+ diffusion, and the p+ diffusion by dynamically controlling the size, position and location of the variable mask aperture 107 of the variable aperture masking unit 100.

Once the diffusion areas have been formed, the laser system 300 of FIG. 3A may be used to perform anneal processing to activate the impurities implanted in the source and drain regions of the transistors of the semiconductor device 517 in the each target die 307 of the semiconductor wafer 309. During the laser anneal processing, the laser system 300 may scan a plurality of semiconductor dies of the semiconductor wafer 309 with a laser beam 302. The laser beam 302 may be projected, under control of the control unit 311, onto a small portion of the semiconductor wafer 309 (e.g., anneal processing area A1 of a target die 307) at a time, and the laser beam steps forward until all of the semiconductor wafer 309 (e.g., every scan point of all anneal processing areas of each target die 307 of the plurality of semiconductor dies of the semiconductor wafer 309) is scanned by the laser beam 302.

The variable aperture masking unit 100 controls the anneal area and defines the size for ion implantation by dynamically moving the isolation panels 105 and may control the size, position and shape of the diffusion area to fit the demand of many advanced device diffusion processes. For example, the variable aperture masking unit 100 allows for reduced pattern loading effect during processing, allows for die by die defining of laser thermal areas and for laser energy tuning during wafer fabrication, and eliminates and/or avoids unnecessary annealing of undesirable areas. The variable aperture masking unit 100 provides reduced stitching effect during anneal processing, provides for the ability to customize anneal processing based on production layout of the dies and the wafer, and allows for "hot edges" to be arranged only on the "scrubber line" and/or only on areas of the wafer that are not functional (e.g., scribe lines, production loss edge dies, and the like). Furthermore, the variable aperture masking unit 100 allows for mask usage savings while still providing specific areas to directly implant ions.

In accordance with an embodiment, a semiconductor manufacturing device includes a plurality of tracks; a plurality of carriers arranged on corresponding tracks of the plurality of tracks, each of the plurality of carriers being controllable to travel to a specified location along a track of the plurality of tracks; a plurality of isolation panels coupled to the plurality of carriers with an aperture defined between edges of the plurality of isolation panels; an aperture control unit to control a desired size of the aperture; and a semiconductor wafer holding apparatus. In an embodiment, the carriers comprise DC/AC motors. In an embodiment, the plurality of isolation panels comprises quartz. In an embodiment, the plurality of isolation panels comprises graphite. In an embodiment, each isolation panel of the plurality of isolation panels spans between and is held in position by a coordinated pair of carriers coupled to a pair of the plurality of tracks on opposing sides of the semiconductor manufacturing device. In an embodiment, a first set of isolation panels are held in position by a first set of the coordinated pairs of carriers, the first set of the coordinated pairs of carriers being coupled to a first pair of tracks on opposing sides of the apparatus, and wherein a second set of isolation panels are held in position by a second set of the coordinated pairs of carriers, the second set of the coordinated pairs of carriers being coupled to a second pair of tracks on opposing sides of the apparatus, the second pair of tracks on opposing sides of the apparatus being arranged in a direction perpendicular to the first pair of tracks on opposing sides of the apparatus. In an embodiment, the first set of isolation panels is separated from the second set of isolation panels by a first distance greater than zero.

In accordance with another embodiment, a method includes arranging a first chip area of a semiconductor substrate into a first position; aligning edges of a plurality of sliding plates to set a size of a first aperture of an adjustable mask; passing a first ion beam through the first aperture; introducing a first impurity of the first ion beam into the semiconductor substrate in a first region within the first chip area; aligning edges of the plurality of sliding plates to set a size of a second aperture of the adjustable mask, the size of the second aperture being different from the size of the first aperture; passing a second ion beam through the second aperture; and introducing a second impurity of the second ion beam into the semiconductor substrate in a second region within the first chip area. In an embodiment the method further includes aligning edges of the plurality of sliding plates to set a size of a third aperture of the adjustable mask; passing a first laser beam through the third aperture of the adjustable mask to project the first laser beam onto the first region within the first chip area with a first on-wafer energy density; aligning edges of the plurality of sliding plates to set a size of a fourth aperture of the adjustable mask, the size of the third aperture being different from the size of the fourth aperture; and passing a second laser beam through the fourth aperture of the adjustable mask to project the second laser beam onto the second region within the first chip area with a second on-wafer energy density, the second on-wafer energy density being different from the first on-wafer energy density. In an embodiment a location of the second region within the first chip area is different from a location of the first region within the first chip area. In an embodiment the first on-wafer energy density is 1.2 J/cm$^2$; and the second on-wafer energy density is 0.5 J/cm$^2$. In an embodiment the introducing the first impurity of the first ion beam into the first region within the first chip area comprises performing a first implantation of a first ion in a silicon substrate of the first chip area, and wherein the introducing the second impurity of the second ion beam into the second region within the first chip area comprises performing a second implantation of a second ion in the silicon substrate of the first chip area.

In yet another embodiment, a method includes moving an isolation panel of a plurality of isolation panels of a variable area masking unit to a first unique position such that a first aperture of the variable area masking unit is defined between edges of the plurality of isolation panels; and performing a first series of a first dopant implantation process using the first aperture of the variable area masking unit to expose a first implantation area in a series of target dies on a semiconductor wafer and using the plurality of isolation panels of the variable area masking unit to mask areas of the semiconductor wafer outside of the first implantation area in the series of target dies. In an embodiment the method further includes moving the isolation panel of the plurality of isolation panels of the variable area masking unit to a second unique position such that a second aperture of the variable area masking unit is defined between edges of the plurality of isolation panels; and performing a second series of a second dopant implantation process using the second aperture of the variable area masking unit to expose a second implantation area in the series of target dies on the semiconductor wafer and using the plurality of isolation panels of the variable area masking unit to mask areas of the semiconductor wafer outside of the second implantation area in the series of target dies. In an embodiment the method further includes moving the isolation panel of the plurality of isolation panels of the variable area masking unit to a third unique position such that a third aperture of the variable area masking unit is defined between edges of the plurality of isolation panels; and performing a third dopant implantation process using the third aperture of the variable area masking unit to expose a third implantation area on the semiconductor wafer and using the plurality of isolation panels as a mask to block areas of the semiconductor wafer outside of the third implantation area. In an embodiment the method further includes conducting a first series of movements of the semiconductor wafer to align each of a series of target dies of the semiconductor wafer into a position to receive the first dopant implantation using the first aperture to form an n-well region of a first semiconductor device in each of the series of target dies; conducting a second series of movements of the semiconductor wafer to arrange and align each of the series of target dies of the semiconductor wafer into a position to receive the second dopant implantation using the second aperture to form an n+ source/drain region of the first semiconductor device in each of the series of target dies; and conducting a third series of movements of the semiconductor wafer to arrange and align each of the series of target dies into a position to receive the third dopant implantation using the third aperture to form a p+ source/drain region of the first semiconductor device in each of the series of target dies. In an embodiment the method further includes moving the isolation panel of the plurality of isolation panels of the variable area masking unit to a fourth unique position such that a fourth aperture of the variable area masking unit is defined between edges of the plurality of isolation panels; and performing a series of fourth dopant implantations using the fourth aperture of the variable area masking unit to form a n+ source/drain region of the first semiconductor device in each of the series of target dies arranged and aligned in the position to receive the second dopant implantation. In an embodiment the method further includes moving the isolation panel of the plurality of isolation panels of the variable area masking unit to a fifth unique position such that a fifth aperture of the variable area masking unit is defined between edges of the plurality of isolation panels; and performing a series of fifth dopant implantations using the fifth aperture of the variable area masking unit to form a p+ source/drain region of the first semiconductor device in each of the series of target dies arranged and aligned in the position to receive the third dopant implantation. In an embodiment the performing the first dopant implantation process, comprises performing a phosphorus diffusion process, wherein the performing the second dopant implantation process comprises performing an arsenic implantation process, and wherein the performing the third dopant implantation process comprises performing a boron implantation process. In an embodiment the method further includes moving a second isolation panel of a second plurality of isolation panels of a second variable area masking unit to a second unique position; directing a laser through the second variable area masking unit; and annealing the semiconductor wafer with the laser.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
arranging a first chip area of a semiconductor substrate into a first position;
aligning edges of a plurality of sliding plates to set a size of a first aperture of an adjustable mask;
passing a first ion beam through the first aperture;
introducing a first impurity of the first ion beam into the semiconductor substrate in a first region within the first chip area;
aligning edges of the plurality of sliding plates to set a size of a second aperture of the adjustable mask, the size of the second aperture being different from the size of the first aperture;
passing a second ion beam through the second aperture; and
introducing a second impurity of the second ion beam into the semiconductor substrate in a second region within the first chip area.

2. The method of claim 1, further comprising:
aligning edges of the plurality of sliding plates to set a size of a third aperture of the adjustable mask;
passing a first laser beam through the third aperture of the adjustable mask to project the first laser beam onto the first region within the first chip area with a first on-wafer energy density;
aligning edges of the plurality of sliding plates to set a size of a fourth aperture of the adjustable mask, the size of the third aperture being different from the size of the fourth aperture; and
passing a second laser beam through the fourth aperture of the adjustable mask to project the second laser beam onto the second region within the first chip area with a second on-wafer energy density, the second on-wafer energy density being different from the first on-wafer energy density.

3. The method of claim 2, wherein a location of the second region within the first chip area is different from a location of the first region within the first chip area.

4. The method of claim 3, wherein the first on-wafer energy density is 1.2 $J/cm^2$; and wherein the second on-wafer energy density is 0.5 $J/cm^2$.

5. The method of claim 3, wherein the introducing the first impurity of the first ion beam into the first region within the first chip area comprises performing a first implantation of a first ion in a silicon substrate of the first chip area, and wherein the introducing the second impurity of the second ion beam into the second region within the first chip area comprises performing a second implantation of a second ion in the silicon substrate of the first chip area.

6. A method, comprising:
arranging a first chip area of a semiconductor substrate into a first position;
aligning edges of a plurality of sliding plates to set a size of a first aperture of an adjustable mask;
passing a first ion beam through the first aperture, the first ion beam being one of a first series of ion beams using the first aperture;
introducing a first impurity of the first ion beam into the semiconductor substrate in a first region within the first chip area;
aligning edges of the plurality of sliding plates to set a size of a second aperture of the adjustable mask, the size of the second aperture being different from the size of the first aperture;
passing a second ion beam through the second aperture; and
introducing a second impurity of the second ion beam into the semiconductor substrate in a second region within the first chip area.

7. The method of claim 6, further comprising:
aligning edges of the plurality of sliding plates to set a size of a third aperture of the adjustable mask;

passing a first laser beam through the third aperture of the adjustable mask to project the first laser beam onto the first region within the first chip area with a first on-wafer energy density;
aligning edges of the plurality of sliding plates to set a size of a fourth aperture of the adjustable mask, the size of the third aperture being different from the size of the fourth aperture; and
passing a second laser beam through the fourth aperture of the adjustable mask to project the second laser beam onto the second region within the first chip area with a second on-wafer energy density, the second on-wafer energy density being different from the first on-wafer energy density.

8. The method of claim 7, wherein a location of the second region within the first chip area is different from a location of the first region within the first chip area.

9. The method of claim 8, wherein the first on-wafer energy density is 1.2 J/cm$^2$; and wherein the second on-wafer energy density is 0.5 J/cm$^2$.

10. The method of claim 8, wherein the introducing the first impurity of the first ion beam into the first region within the first chip area comprises performing a first implantation of a first ion in a silicon substrate of the first chip area, and wherein the introducing the second impurity of the second ion beam into the second region within the first chip area comprises performing a second implantation of a second ion in the silicon substrate of the first chip area.

11. A method, comprising:
arranging a first chip area of a semiconductor substrate into a first position;
aligning edges of a plurality of sliding plates to set a size of a first aperture of an adjustable mask, the plurality of sliding plates being coupled to a plurality of carriers arranged on corresponding tracks of a plurality of tracks;
passing a first ion beam through the first aperture;
introducing a first impurity of the first ion beam into the semiconductor substrate in a first region within the first chip area;
aligning edges of the plurality of sliding plates to set a size of a second aperture of the adjustable mask, the size of the second aperture being different from the size of the first aperture;
passing a second ion beam through the second aperture; and
introducing a second impurity of the second ion beam into the semiconductor substrate in a second region within the first chip area.

12. The method of claim 11, further comprising:
aligning edges of the plurality of sliding plates to set a size of a third aperture of the adjustable mask;
passing a first laser beam through the third aperture of the adjustable mask to project the first laser beam onto the first region within the first chip area with a first on-wafer energy density;
aligning edges of the plurality of sliding plates to set a size of a fourth aperture of the adjustable mask, the size of the third aperture being different from the size of the fourth aperture; and
passing a second laser beam through the fourth aperture of the adjustable mask to project the second laser beam onto the second region within the first chip area with a second on-wafer energy density, the second on-wafer energy density being different from the first on-wafer energy density.

13. The method of claim 12, wherein a location of the second region within the first chip area is different from a location of the first region within the first chip area.

14. The method of claim 13, wherein the first on-wafer energy density is 1.2 J/cm$^2$; and wherein the second on-wafer energy density is 0.5 J/cm$^2$.

15. The method of claim 13, wherein the introducing the first impurity of the first ion beam into the first region within the first chip area comprises performing a first implantation of a first ion in a silicon substrate of the first chip area, and wherein the introducing the second impurity of the second ion beam into the second region within the first chip area comprises performing a second implantation of a second ion in the silicon substrate of the first chip area.

16. The method of claim 15, wherein the first ion comprises phosphorous.

17. The method of claim 16, wherein the second ion comprises arsenic.

18. The method of claim 13, wherein the introducing the second impurity is performed at least in part at an energy level between about 100 eV and about 10 K eV.

19. The method of claim 18, wherein the introducing the second impurity is performed at least in part at an energy level between about 100 eV and about 1 K eV.

20. The method of claim 13, wherein the introducing the first impurity is performed at least in part at an energy level between about 1 K eV and about 100 K eV.

* * * * *